United States Patent [19]

Ahonen

[11] Patent Number: 5,574,981
[45] Date of Patent: *Nov. 12, 1996

[54] METHOD AND ARRANGEMENT FOR MEASURING THE CONDITION OF A RECEIVER ANTENNA

[75] Inventor: Jalo Ahonen, Oulu, Finland

[73] Assignee: Nokia Telecommunications Oy, Espoo, Finland

[*] Notice: The portion of the term of this patent subsequent to Aug. 30, 2014, has been disclaimed.

[21] Appl. No.: 284,578

[22] PCT Filed: Dec. 29, 1993

[86] PCT No.: PCT/FI93/00565

§ 371 Date: Aug. 30, 1994

§ 102(e) Date: Aug. 30, 1994

[87] PCT Pub. No.: WO94/16336

PCT Pub. Date: Jul. 21, 1994

[30] Foreign Application Priority Data

Dec. 30, 1992 [FI] Finland ................................. 925954

[51] Int. Cl.$^6$ ................................................. H04B 17/00
[52] U.S. Cl. ........................... 455/67.4; 455/115; 370/13
[58] Field of Search ....................... 455/56.1, 67.1, 455/67.4, 226.1, 226.2, 226.3, 226.4, 289, 280, 282, 283, 89, 115; 370/13, 17, 95.3; 324/645; 343/703

[56] References Cited

U.S. PATENT DOCUMENTS 4,962,359  10/1990  Dunsmore .

FOREIGN PATENT DOCUMENTS

| 261828 | 3/1988 | European Pat. Off. . |
| 3317358 | 10/1991 | Germany . |
| 9119363 | 12/1991 | WIPO . |
| 9203744 | 3/1993 | WIPO . |

*Primary Examiner*—Andrew Faile
*Attorney, Agent, or Firm*—Cushman Darby & Cushman, L.L.P.

[57] ABSTRACT

A method and an arrangement for measuring the condition of a receiver antenna at a base station of a TDMA radio system. The method includes a) transmission of a radio frequency measuring signal through an antenna line towards the antenna, b) measurement of the strength of a measuring signal component reflected back and passed along a predetermined measuring path, c) transmission of the measuring signal directly towards the receiver to the measuring path, d) measurement of the strength of the measuring signal transmitted directly along the measuring path. The measurement is performed in a time slot allocated for a radio test loop, due to which it is possible to utilize frequencies actually used for traffic.

1 Claim, 1 Drawing Sheet

5,574,981

METHOD AND ARRANGEMENT FOR MEASURING THE CONDITION OF A RECEIVER ANTENNA

BACKGROUND OF THE INVENTION

The invention relates to a method for measuring the condition of a receiver antenna at a base station of a TDMA radio system, the method comprising a) transmission of a radio frequency measuring signal through an antenna line towards the antenna, b) measurement of the strength of a measuring signal component reflected back and passed along a predetermined measuring path, c) transmission of the measuring signal directly towards the receiver to said measuring path, d) measurement of the strength of the measuring signal transmitted directly along the measuring path.

A substantial part of radio systems, for instance cellular radio telephone systems and base stations thereof, are receiver and transmitter antennas, the condition of which influences the quality of connections. The condition of the antennas can be controlled, e.g. by measuring the standing wave ratio of the antennas, i.e. electrical matching of the antennas to the rest of the receiver and transmitter system.

By means of present methods, the measurement is performed by supplying power through the antenna line to the receiver antenna and by measuring the power reflected back from the antenna along the antenna line by means of a broadband power meter. Due to the broadband power meter, the power used for the measurement must be high in order that the measurement will not be sensitive to interference, which means that signals received by the antenna do not disturb the measurement. Using high power causes intermodulation distortion in the receiver. These problems can be avoided by using a duplex filter separating from each other the measuring signal and the signals intended to be received. However, the duplex filter must be installed before the receiver parts, which weakens the sensitivity of the receiver, because the filter causes losses in the antenna signal.

A further solution is known, avoiding both above-mentioned problems by using a measuring frequency outside the receiver band and a narrow-band power measurement adapted to this frequency.

European Patent Application 0 261 828 discloses an analyzer of microwave range, measuring a signal supplied directly from a measuring source as well as a signal reflected from the microwave network to be analyzed, for a vector-based relative power measurement. At measurement of reflected power, a sample signal taken of the output power of a measuring generator is brought to a detector along a path different from the path of a sample signal taken of the power reflected from the microwave network to be analyzed. Thus, the relative measurement of the reference cited is somewhat insensitive to variations in the output level of the measuring generator, but since the signals to be compared with each other use different paths to the detector, the measurement does not automatically consider non-idealities or changes in the properties of the components present on signal paths. The analyzer must be calibrated for the measurement of the reflected power by measuring a known microwave standard at first with the analyzer and by using thus obtained calibration values for later measurements. For measuring the condition of an antenna, this would mean that the power supply of the antenna should be connected to some microwave standard instead of the antenna for the calibration.

This problem has been solved in the Finnish Patent Application 904085 in such a way that, in addition to the signal reflected from the antenna, also the strength of the measuring signal sent directly towards the receiver is measured separately. By this second measurement is obtained a reference value for the strength of the measuring signal, which value considers at the measuring moment the transmission power of a measuring signal transmitter and the properties of the components present on the signal path, such as amplifiers and branching elements, and with which value the strength of a measuring signal component reflected from the antenna is compared. By a relative measurement of this kind, it is possible to eliminate the influence of the components present in the measuring circuit and on the measuring signal path between the properties of individual components or the influence of temporal changes in the properties of an individual component on the accuracy of measurement. Manual checkings and calibrations during installation and operation can also be reduced and simplified substantially or they can even be entirely avoided. The measuring signal is preferably a narrow-band signal, the frequency of which is outside the frequency band allocated for traffic, due to which the measurement does not disturb the actual radio traffic, but, on the other hand, the measurement is not performed at actually used frequencies either, and for this reason, an actual standing wave ratio SWR will not be obtained.

New digital TDMA-type (TDMA=Time Division Multiple Access) radio systems have time-division signalling including several, typically 8, time slots at one frequency. One TDMA system is the pan-European mobile telephone system GSM. The GSM Specification 12.11, 3.1.0 B 05 "Receiver Antenna Fault" states requirements for the control of the condition of the antenna.

SUMMARY OF THE INVENTION

The object of the invention is to implement a control of the condition of an antenna at a TDMA base station at actually used frequencies.

This is achieved by means of a method of the type presented in the introduction, the method being according to the invention characterized in that the measuring signal is sent at a frequency allocated for the radio traffic of the radio system in a TDMA time slot of the base station intended for an establishment of a radio test loop.

Another aspect of the invention is an arrangement for measuring the condition of a receiver antenna at a base station of a TDMA radio system, comprising a means for generating a radio frequency measuring signal; a first directional coupler means for applying the measuring signal to an antenna line towards the antenna; a second directional coupler means for applying the measuring signal to the antenna line towards the receiver; means for switching the radio frequency measuring signal from the means generating the measuring signal alternately to the first and the second directional coupler means; means for measuring the strength of a measuring signal component sent towards the antenna and reflected back from the antenna and the strength of the measuring signal sent directly towards the receiver. The arrangement is according to the invention characterized in means for permitting a measurement on a radio channel allocated for the radio traffic of the radio system in a TDMA time slot of the base station intended for an establishment of a radio test loop.

In the invention, the measurement is performed in a time slot allocated for a radio test loop, which makes it possible to utilize frequencies actually used for the traffic. In a preferred embodiment of the invention, a radio frequency measuring signal is generated at transmission frequency in a transmitter and looped through the radio test loop at reception frequency to the receiver antenna line, due to which a separate measuring signal generator is avoided.

BRIEF DESCRIPTION OF THE DRAWING

In the following, the invention will be explained in more detail by means of illustrative embodiments with reference to the attached drawing, in which.

DETAILED DESCRIPTION

The invention is suitable for being used in a full duplex-type transceiver of a base station of TDMA radio systems.

Figure 1:
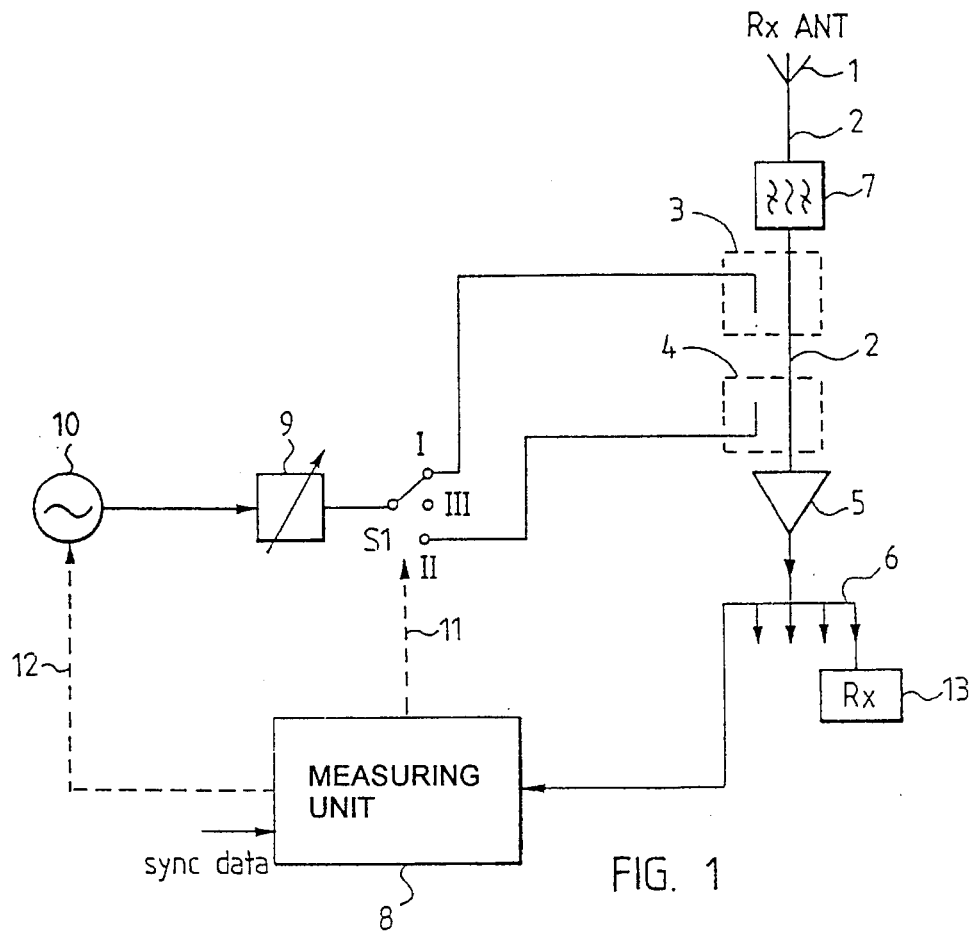
FIG. 1 shows a block diagram of a base station receiver equipment according to the invention.

FIG. 1 illustrates only a base station receiver equipment and only those parts which are essential for explaining and understanding the invention. A receiver antenna 1 is connected by means of an antenna cable 2 through a bandpass filter 7 and a dividing amplifier 5 to a branching element 6, which divides a signal coming from the antenna direction into two or several branches. The branching element 6 is used especially in radio systems comprising many frequency channels, each frequency channel having a receiver of its own after the branching element. The filter 7 may also be located between a directional coupler 4 and the amplifier 5.

A measuring signal source 10, e.g. a signal generator, generates a radio frequency measuring signal to be used for the measurement of the condition of the antenna, the frequency of this signal corresponding to one of the normal reception frequencies of the ,receiver, preferably within the range 800 to 1000 MHz. To an output of the signal generator 10 can be switched an adjustable attenuator or amplifier 9 for the adjustment of the strength of the measuring signal to be transmitted. The measuring signal is led from the attenuator 9 to a change-over switch S1, switching the measuring signal to a directional coupler means 3 in a first position I and to the directional coupler 4 in a second position II and disconnecting the measuring signal from the directional coupler means 3, 4 in a third position III. The directional coupler means 3 and 4 are switched to the antenna line 2 in such a way that the directional coupler means 3 directs the measuring signal to be transmitted along the antenna line towards the antenna and the directional coupler means 4 directs the measuring signal to be transmitted along the antenna line towards the receiver 13.

One output of the branching element 6 is connected to a measuring unit 8 measuring the strength of the measuring signal coming from the branching element. The measuring unit may be, for instance, a power meter, to which is connected a logic circuitry for necessary control and calculation operations. For the measurement may also be used measuring equipment possibly included in the receiver already.

Further, the measuring unit 8 of the shown embodiment controls the changeover switch S1 through control line 11. The measurement takes place at the normal reception frequencies of the radio system during normal operation of a receiver Rx. The receiver Rx receives from the antenna a TDMA signal, each frequency of which comprises several, typically 8, time slots. The signal has additionally a frame structure having, e.g., eight successive time slots constituting a frame. Further, frames can form multiframes (e.g. 26 or 52 frames) and multiframes can form hyperframes. One TDMA system is the pan-European mobile telephone system GSM. Time slots are mainly used for transferring control and traffic channels. In the GSM system, for instance, at least one time slot of a frame, multiframe or hyperframe is, however, allocated for formation of a radio test loop from the transmitter to the receiver. The radio test loop is normally intended for testing RF parts of a base station, excluding the receiver antenna and the receiver antenna cable.

In the invention, the condition of the receiver antenna 1 is measured in this time slot allocated for the radio test loop. Outside this allocated time slot, the measuring unit 8 controls a disconnector to position III, in which the measuring signal is disconnected from the antenna line 2. Through control line 12, the measuring unit 8 may alternatively prevent the signal source 10 from generating the measuring signal outside said test time slot and permits it in the test time slot. The control unit 8 receives time slot information in a signal SYNC DATA, e.g. from a synchronization and control unit of the entire receiver equipment.

When measuring the condition of the antenna 1 in the test time slot, the switch S1 switches the measuring signal from the signal generator 10 to the directional coupler means 4, which directs the measuring signal towards the receiver, whereby the signal passes through the amplifier 5 and the branching element 6 to the measuring unit 8, which measures the strength or power of the signal and stores the measured value as a reference value for later use. Then, the switch S1 changes its position and switches the measuring signal to the directional coupler means 3, which directs the measuring signal along the antenna line 2 to the antenna 1. A measuring signal component reflected from the antenna 1 back to the antenna line 2 passes through each directional coupler means 3 and 4, the amplifier 5 and the branching element 6 to the measuring unit 8, which remeasures the strength value of the reflected signal. Subsequently, the measuring unit 8 calculates by means of the reference value and the strength of the reflected signal an SWR or SRRI value, which is compared with preset alarm limits, upon exceeding of which the measuring unit gives the alarm in a suitable form.

As described previously, a transceiver often utilizes a radio test loop, in which a radio frequency test signal generated by the transmitter part is led in a correct manner back to the receiver part of the same transceiver for reception and analysis. Such a radio test loop of a transceiver is described e.g. in the Finnish Patent 85080, which is incorporated herein by reference.

Figure 2:
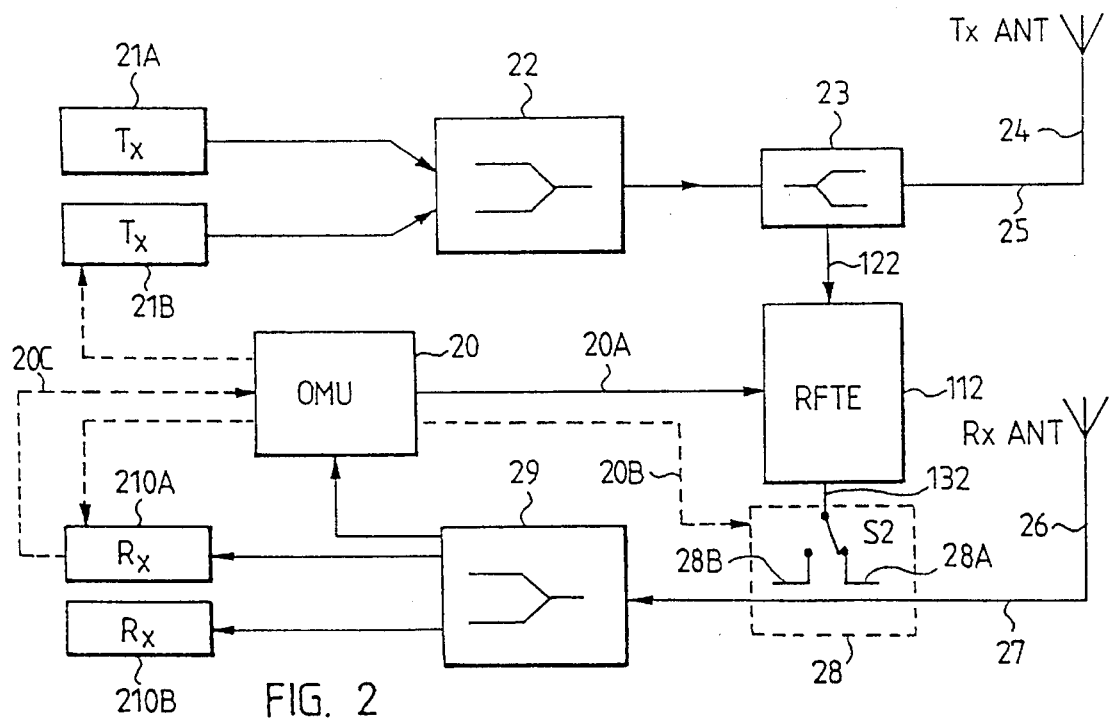
FIG. 2 shows a block diagram of a base station transceiver equipment according to the invention.

In a preferred embodiment of the invention shown in FIG. 2, a radio test signal looped during a radio test time slot from the transmitter part to the receiver antenna line is used as a measuring signal and sent on a radio channel (at a frequency) used for the normal traffic of the radio system.

In FIG. 2, a TDMA transceiver comprises at least two, preferably 4, pairs of transceivers 21A, 210A and 21B, 210B, respectively, each pair constituting one full duplex connection. The outputs of the transmitter units 21A and 21B are connected by means of a combining element 22 (combiner) to a common antenna line 25 and to a common transmitter antenna 24. A receiver antenna 26 is connected through an antenna line 27 to a branching element 29, which divides the received signal to the receiver units 210A and 210B. In this connection, transmitter and receiver units primarily signify the radio parts of a transceiver. Each transmitter and receiver unit has a dedicated transmission or reception frequency, whereby the transmission and reception frequencies of the units, such as 21A and 210A, constituting a full duplex pair, are at a distance of a duplex spacing, e.g. 45 MHz, from each other.

A radio test unit 112 is connected between the antenna lines 25 and 27. For this purpose, the antenna line 25 comprises a branching element 23, which branches off a portion of a transmission RF signal to an input 122 of the radio test unit 112. The radio test unit 112 converts the transmission frequency signal into a reception RF signal. An output 132 of the radio test unit 112 is connected to the antenna line 27 by means of a switching unit 28, comprising an RF switch S2 and directional couplers 28A and 28B.

Testing operations are controlled by an operation and maintenance unit 20 of the base station, which unit commands the test unit 112 through a control line 20A to form a test loop in a predetermined test time slot and informs whether the measuring signal is switched towards the antenna or the receiver. In a preferred embodiment of the invention, the test unit 112 controls the switch S2 on the DC level of its output 132. The unit 28 contains a detector of the DC level and switches the output 132 on the basis of the detected DC level either to the directional coupler 28A or 28B. The directional coupler 28A directs the measuring signal towards the antenna 26 for a reflection measurement of the antenna. The directional coupler 28B directs the signal towards the receiver for a conventional test loop or for a reference measurement of the antenna measurement. This solution requires fewest additional cables and changes least the previous test loop. The switch S2 may also be controlled directly from the OMU 20, as illustrated by broken lines 20B. Outside the test time slot, the measuring signal is disconnected from the output 132 by means of a disconnector inside the unit 112.

The OMU 20 acts also as a measuring unit, which receives a signal from the branching element 29 and measures the strength of the signal. Alternatively, the receivers Rx may contain a measuring equipment, the measuring result of which is received by the OMU 20 through line 20C.

The measuring procedure is as follows. The quantity to be measured is the standing wave ratio SWR of the antenna.

1) The OMU 20 gives the test unit 112 a normal radio test loop command, in consequence of which the measuring signal is looped in the test time slot to the switch S2 switching the measuring signal on the basis of the DC level it has detected to the directional coupler 28B sending the measuring signal directly towards the receiver. The OMU 20 measures the strength of the measuring signal and uses an RSSI value formed from the measurement result as a reference value REFSIGN.

2) The OMU 20 gives the test unit 112 a new radio test loop command to direct the measuring signal towards the antenna 6, however. The test unit 112 changes the DC level of its output, in consequence of which the switch S2 switches the measuring signal to the directional coupler 28A. The OMU 20 measures the strength of the signal component reflected from the antenna 26 and uses the RSSI value of the strength of the received signal, formed from the measurement result, as a measured value ANTSIGN.

(Preferably, steps 1) and 2) are carried out in separate, e.g., temporally successive TDMA time slots.)

3) The OMU 20 calculates the SWR of the antenna from these two values ANTSIGN and REFSIGN.

4) The OMU 20 compares the calculated SWR value with the stored alarm limits. If the calculated value is higher/ lower than the alarm limit, the alarm is given. The data base of the OMU 20 contains a calibrated SWR value for each used frequency, preferably also for each antenna sector and both for a normal antenna and a diversity antenna. During a setup of the base station or when the antenna or the antenna cable is changed, the measurements 1, 2 and 3 of each frequency, sector and antenna to be used are gone through and the SWR values obtained as a result are stored as calibrated values in the data base of the OMU.

The figure and the description attached thereto are only intended to illustrate the present invention. As to the details, the method and the arrangement according to the present invention may vary within the scope of the attached claims.

I claim:

1. A test apparatus for a base station of a TDMA radio system, comprising:

a radio test loop having a control input, an output, and an input connected to a transmitting antenna line of a base station to receive a transmitting frequency test signal from a transmitter of said base station, said radio test loop converting said transmitting frequency test signal to a receiving frequency and outputting said receiver frequency test signal at said output, a switch unit having an input connected to said output of said radio test loop, a first output, a second output, and a control input, said switch unit being responsive to a control signal at said control input for switching said receiving frequency test signal between said first and second outputs, a first directional coupler having an input connected to said first output of said switch unit, said first directional coupler coupling said receiving frequency test signal to a receiving antenna line towards a receiving antenna of said base station, a second directional coupler having an input connected to said second output of said switch unit, said first directional coupler coupling said receiving frequency test signal to a receiving antenna line towards a receiver of said base station, a measuring unit, a controller connected to said control inputs of said radio test loop and said switch unit, a radio test loop made in which said switch means is controlled to switch said receiving frequency test signal to said second directional coupler in a TDMA time slot allocated for establishing said radio test loop, and a receiving antenna test mode having A) a first test configuration in which said switch means is controlled to switch said receiving frequency signal to said first directional coupler in a TDMA time slot allocated for said radio test loop, and said measuring unit is controlled by said controller to measure the level of said receiving frequency signal reflected from said receiving antenna, and B) a second test configuration in which said switch means is controlled to switch said receiving frequency signal to said second directional coupler in a TDMA time slot allocated for said radio test loop, and said measuring unit is controlled by said controller to measure the level of said receiving frequency signal transmitted towards said receiver, said controller being arranged to determine the standing wave ratio of said receiving antenna on basis of measurements carried out in said first and second configuration.

* * * * *

UNITED STATES PATENT AND TRADEMARK OFFICE
CERTIFICATE OF CORRECTION

PATENT NO. : 5,574,981
DATED : November 12, 1996
INVENTOR(S) :
AHONEN

It is certified that error appears in the above-indentified patent and that said Letters Patent is hereby corrected as shown below:

On the title page:

Please Change:

"[*] Notice: The portion of the term . . . has been disclaimed."

to

—[*] Notice: The term of this patent shall not extend beyond the expiration date of Patent No. 5,507,010.—

Signed and Sealed this

Seventh Day of October, 1997

BRUCE LEHMAN

Attest:

Attesting Officer

Commissioner of Patents and Trademarks